(12) United States Patent
Sukekawa et al.

(10) Patent No.: US 11,844,208 B2
(45) Date of Patent: Dec. 12, 2023

(54) SEMICONDUCTOR DEVICE AND METHOD OF FORMING THE SAME

(71) Applicant: MICRON TECHNOLOGY, INC., Boise, ID (US)

(72) Inventors: Mitsunari Sukekawa, Hiroshima (JP); Hiroshi Toyama, Sagamihara (JP); Hiroyuki Uno, Chigasaki (JP); Yasutaka Okada, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 86 days.

(21) Appl. No.: 17/678,595

(22) Filed: Feb. 23, 2022

(65) Prior Publication Data

US 2023/0269932 A1 Aug. 24, 2023

(51) Int. Cl.
*H10B 12/00* (2023.01)

(52) U.S. Cl.
CPC ....... *H10B 12/315* (2023.02); *H10B 12/0335* (2023.02); *H10B 12/34* (2023.02); *H10B 12/50* (2023.02)

(58) Field of Classification Search
CPC .. H10B 12/0335; H10B 12/50; H10B 12/315; H10B 12/34; H10B 12/033; H10B 12/053; H01L 21/187; H01L 21/31116; H01L 21/764; H01L 28/90
See application file for complete search history.

(56) References Cited

U.S. PATENT DOCUMENTS

| | | | |
|---|---|---|---|
| 2021/0134804 A1* | 5/2021 | Jung | H01L 28/75 |
| 2021/0407908 A1* | 12/2021 | Huang | H10B 12/34 |
| 2021/0408005 A1* | 12/2021 | Chen | H01L 21/76885 |
| 2022/0059546 A1* | 2/2022 | Chang | H10B 12/053 |
| 2022/0293605 A1* | 9/2022 | Chiang | H10B 12/50 |
| 2023/0030176 A1* | 2/2023 | Lee | H10B 12/0335 |

* cited by examiner

*Primary Examiner* — Meiya Li
(74) *Attorney, Agent, or Firm* — Dorsey & Whitney LLP

(57) ABSTRACT

An apparatus includes a base structure having a first portion including a plurality of transistors and a second portion surrounding the first portion; a storage structure on the first portion of the base structure, the storage structure including a plurality of storage capacitors each coupled to a corresponding one of the plurality of transistors; an interface structure on the second portion of the base structure; and a peripheral structure on the interface structure; wherein the interface structure is divided into a plurality of insulating films and the plurality of insulating films are arranged away from each other to have a plurality of voids between the second portion of the base structure and the peripheral structure.

5 Claims, 17 Drawing Sheets

SEMICONDUCTOR DEVICE AND METHOD OF FORMING THE SAME

BACKGROUND

Dynamic random access memory (hereinafter referred to as DRAM) stores information in units of memory cells, with each memory cell being provided with an access transistor and a storage capacitor connected to either the source or the drain of the access transistor. By providing DRAM with a plurality of memory cells, a high-capacity memory circuit is formed. DRAM is provided with a plurality of functional elements such as transistors and storage capacitors, but if functional elements are affected by a heat treatment performed when forming other functional elements, there is a possibility that the electrical characteristics will change. Accordingly, there has been proposed a technology capable of reducing the influence of heat treatment as much as possible by creating a transistor portion and a storage capacitor portion separately, and then joining the portions later.

BRIEF DESCRIPTION OF THE DRAWINGS

FIGS. 3 and 4 are longitudinal section views illustrating one example of the schematic configuration in an exemplary process stage following the steps illustrated in FIGS. 15 and 16. FIG. 3 is a longitudinal section view illustrating the schematic configuration of a portion along the line A-A in FIG. 1. FIG. 4 is a longitudinal section view illustrating the schematic configuration of a portion along the line B-B in FIG. 1.

FIGS. 5, 6, 7, 10, 13, and 15 are longitudinal section views illustrating the schematic configuration of the portion along the line A-A in FIG. 1. FIGS. 4, 8, 11, 14, and 16 are longitudinal section views illustrating the schematic configuration of the portion along the line B-B in FIG. 1.

FIG. 9 is a diagram illustrating the method of manufacturing the semiconductor device according to the embodiment, and is a longitudinal section view illustrating the schematic configuration of a portion along the line C-C in FIG. 1 in the same steps as FIGS. 7 and 8.

FIG. 12 is a diagram illustrating a method of manufacturing the semiconductor device according to the embodiment, and is a diagram for explaining processes performed in FIGS. 9 and 10.

DETAILED DESCRIPTION

Figure 1:
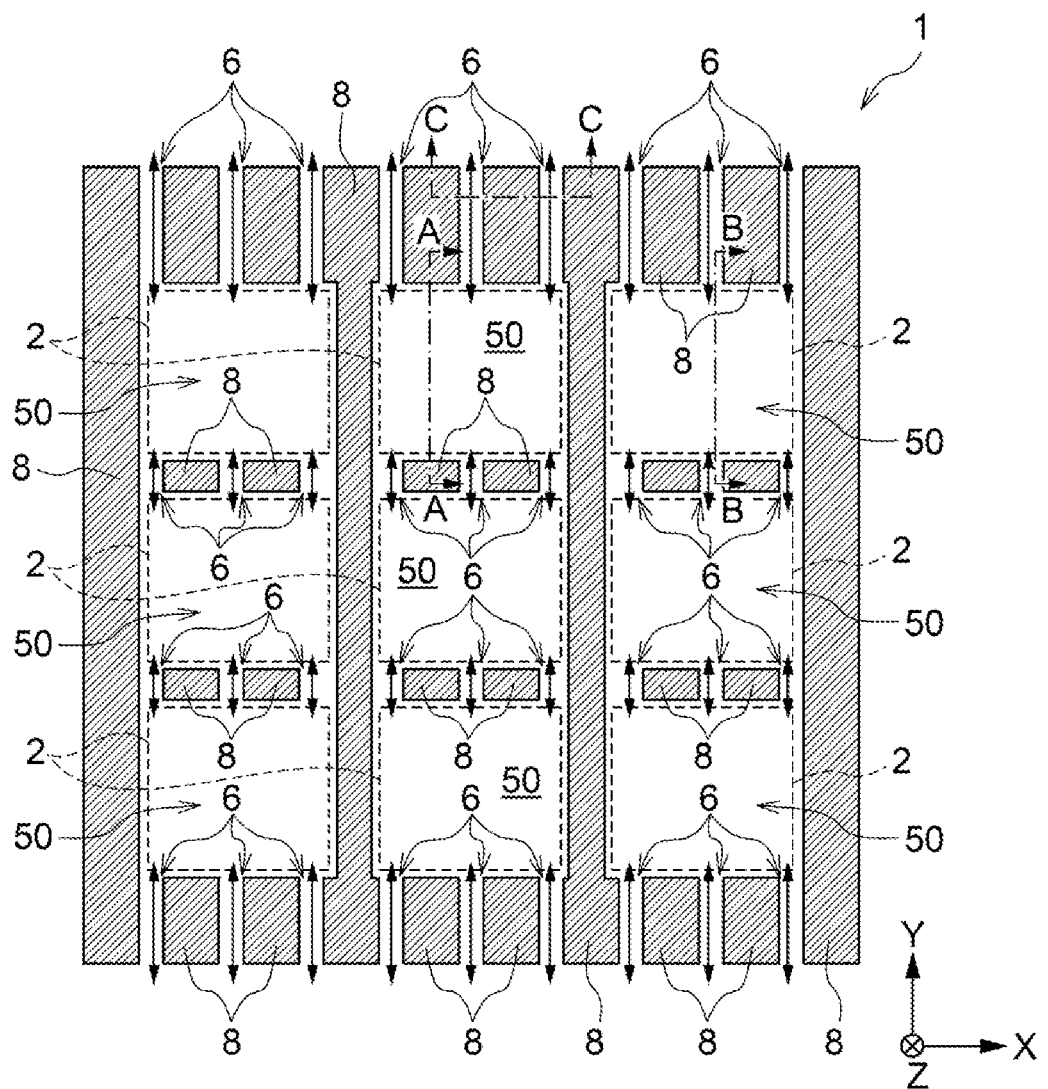
FIG. 1 is a plan view illustrating one example of a schematic configuration of a memory mat region, an interface structure, and an air hole layout in a semiconductor device according to an embodiment.

Various embodiments of the present disclosure will be explained below in detail with reference to the accompanying drawings. The following detailed description refers to the accompanying drawings that show, by way of illustration, specific aspects and various embodiments of the present disclosure. The detailed description provides sufficient detail to enable those skilled in the art to practice these embodiments of the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Hereinafter, a semiconductor device 1 and a method of manufacturing the same according to the embodiment will be described with reference to the drawings. The semiconductor device 1 will be described by taking DRAM as an example. In the description of the embodiment, common or related elements and elements that are substantially the same are denoted with the same signs, and the description thereof will be reduced or omitted. In the drawings, the dimensions and dimensional ratios of the units in the diagrams do not necessarily match the dimensions and dimensional ratios in the embodiment. The directions of up and down, upper and lower, or above and below mentioned herein refer to those in the case where a semiconductor substrate 10 in each corresponding portion in the plan views and longitudinal section views is disposed at the bottom, and the horizontal direction refers to the direction parallel to the surface of the semiconductor substrate 10.

FIG. 1 is a plan view illustrating a schematic configuration of the semiconductor device 1, and illustrates the layout of an interface structure 8 provided in the semiconductor device 1. The semiconductor device 1 is provided with a plurality of memory mat regions 2. The memory mat regions 2 are arranged in a matrix on a semiconductor substrate 10. A plurality of memory cells 15 described later are provided in the memory mat regions 2. The memory cells 15 are DRAM memory elements. An interface structure 8 is provided around each of the memory mat regions 2. The interface structure 8 is provided with a plurality of air holes 6. In FIG. 1, the plurality of air holes 6 are provided in the horizontal direction, or in other words the Y direction, of the memory mat regions 2. Note that, although not illustrated in FIG. 1, memory mat edge portions 4 and peripheral circuit portions 5 described later are disposed surrounding the memory mat regions 2.

Figure 1A:
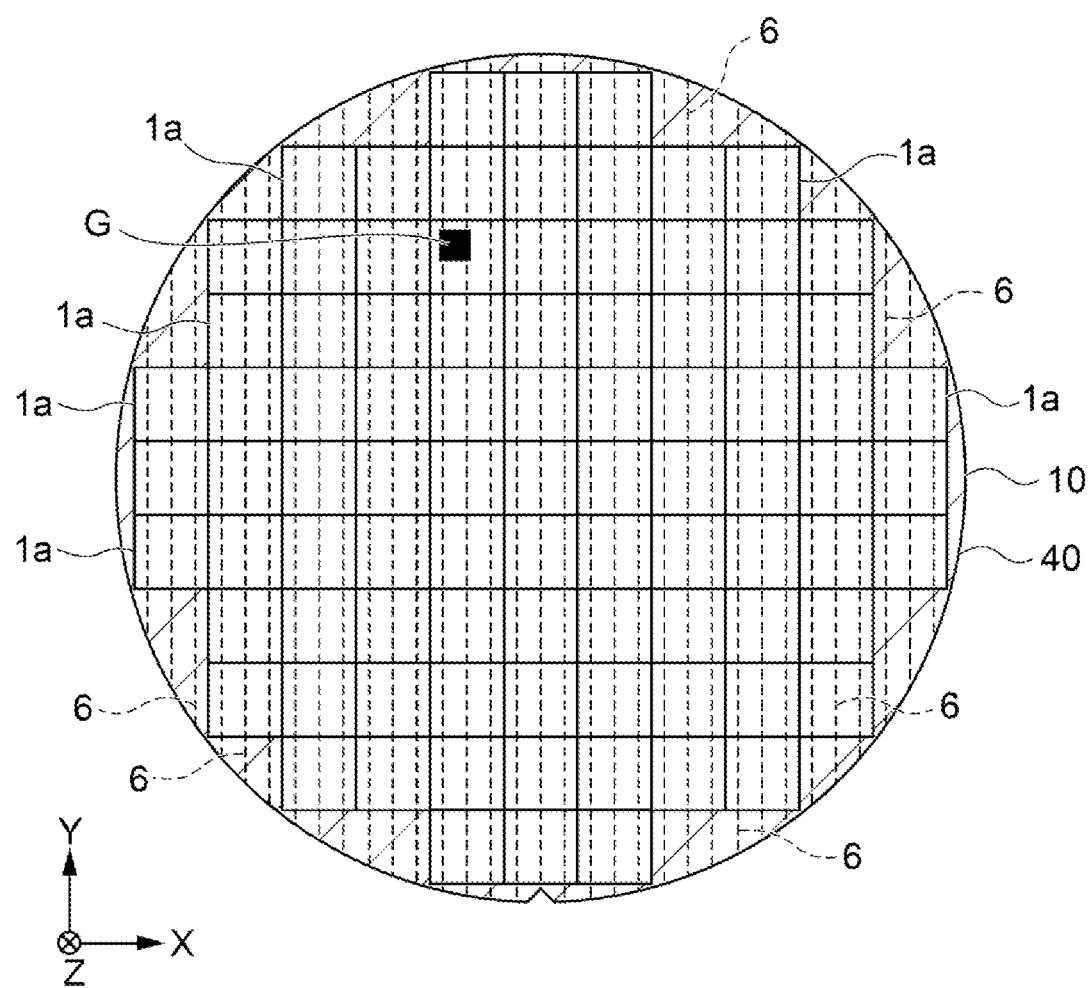
FIG. 1A is a diagram schematically illustrating a state partway through process stages of the semiconductor device according to the embodiment, and illustrates a situation in which air holes extend from one end to another end of a substrate.

The air holes 6 are horizontally penetrating holes formed in the interface structure 8 in the steps described later in FIGS. 10 and 11. In the steps described in FIGS. 10 and 11, a cavity region 50 that acts as a void is formed in each of the memory mat regions 2. Each cavity region 50 is connected to adjacent cavity regions 50 through the air holes 6. Air inside the cavity regions 50 can pass through the air holes 6. The arrows labeled in the air holes 6 in the diagram illustrate the flow of air that may pass through the air holes 6. All of the cavity regions 50 from end to end provided on the semiconductor substrate 10 are interconnected by the air holes 6. FIG. 1A is a diagram schematically illustrating this configuration. In the steps illustrated in FIGS. 10 and 11, the semiconductor substrate 10 and a base substrate 40 are layered with the cavity regions 50 in between.

As illustrated in FIG. 1A, the air holes 6 extend in the Y direction to connect from end to end of the semiconductor substrate 10. Chip regions 1a are arranged in a matrix on the semiconductor substrate 10, and the memory mat regions 2 are formed inside the chip regions 1a. The air holes 6 passes through a plurality of the chip regions 1a, extending from one end of the semiconductor substrate 10 to the other end in the Y direction. FIG. 1 is an enlarged view of the region G illustrated in FIG. 1A. With the configuration illustrated in FIG. 1A, all of the cavity regions 50 are connected to the atmosphere surrounding the semiconductor substrate 10 through the air holes 6. Consequently, if the external atmosphere is depressurized, air passes through the air holes 6, depressurizing the inside all of the cavity regions 50. Note that in FIG. 1A, the air holes 6 are drawn sparsely for the sake of convenience, but in actuality, the air holes 6 are arranged densely.

Figure 2:
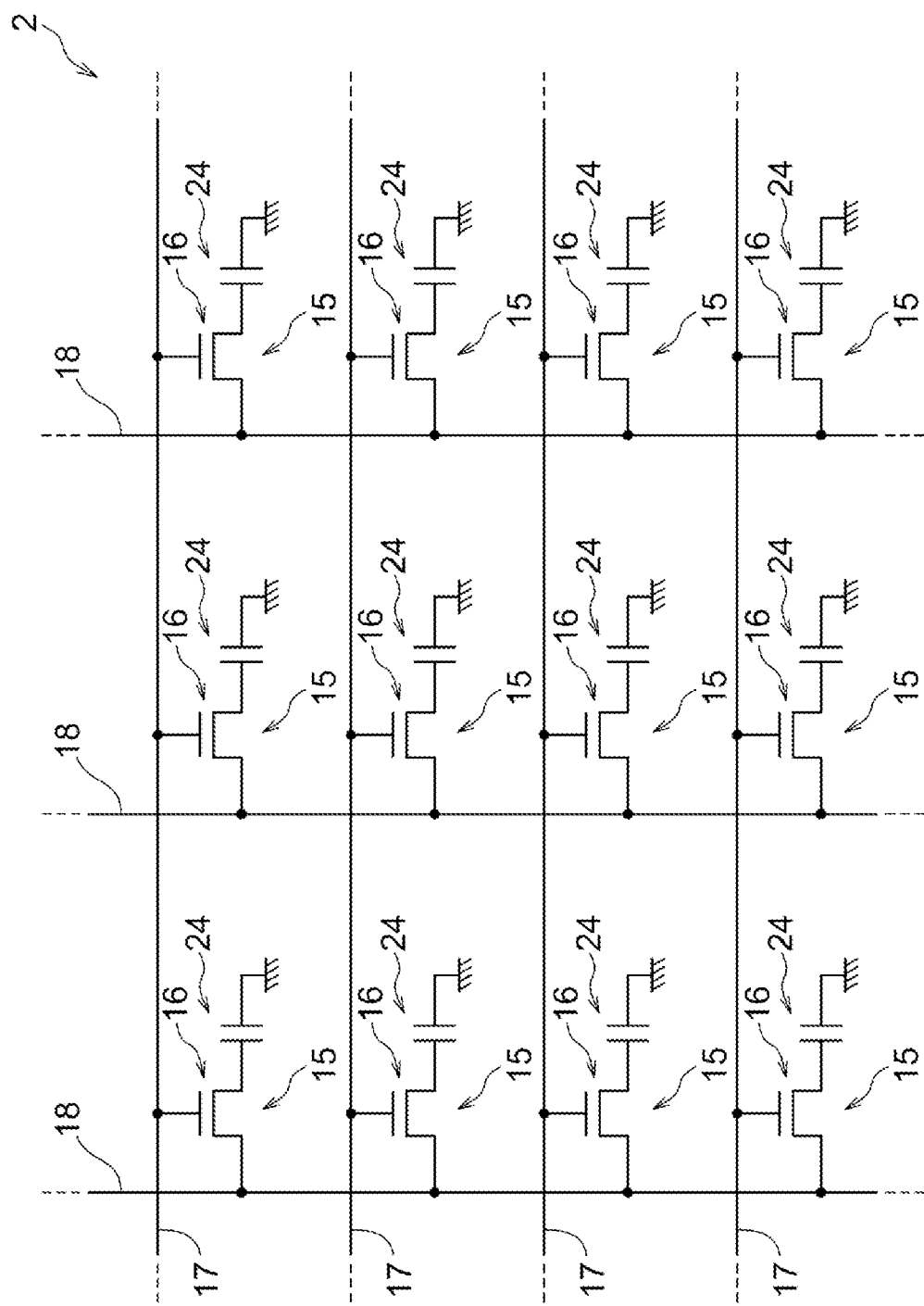
FIG. 2 is a circuit diagram illustrating a schematic configuration of an equivalent circuit of memory cells of the semiconductor device according to the embodiment.

FIG. 2 illustrates an equivalent circuit of a memory cell array of the memory mat regions 2 included in the semiconductor device 1. The plurality of the memory cells 15 are arranged in a matrix, with each memory cell 15 being connected to the intersection point between a plurality of word lines 17 and a plurality of bit lines 18 disposed in straight lines. A single memory cell 15 includes a pair of an access transistor 16 and a storage capacitor 24. The access transistor 16 includes a metal-oxide-semiconductor field-effect transistor (MOSFET). Gate electrodes 16a (see FIG. 3) of the access transistors 16 function as DRAM word lines 17. One of the source or the drain of each access transistor 16 is connected to one of the bit lines 18, while the other is connected to the storage capacitors 24. The storage capacitors 24 include capacitors and store data by accumulating electric charge.

When writing data to a memory cell 15, a potential that turns on the access transistor 16 is applied to the word line 17, while a low potential or a high potential corresponding to "0" or "1" of the data to write is applied to the bit line 18. When reading out data from a memory cell 15, a potential that turns on the access transistor 16 is applied to the word line 17, and a data determination is made by having a sense amplifier connected to the bit line 18 sense the potential drawn out from the storage capacitors 24 to the bit line 18.

Figure 3:
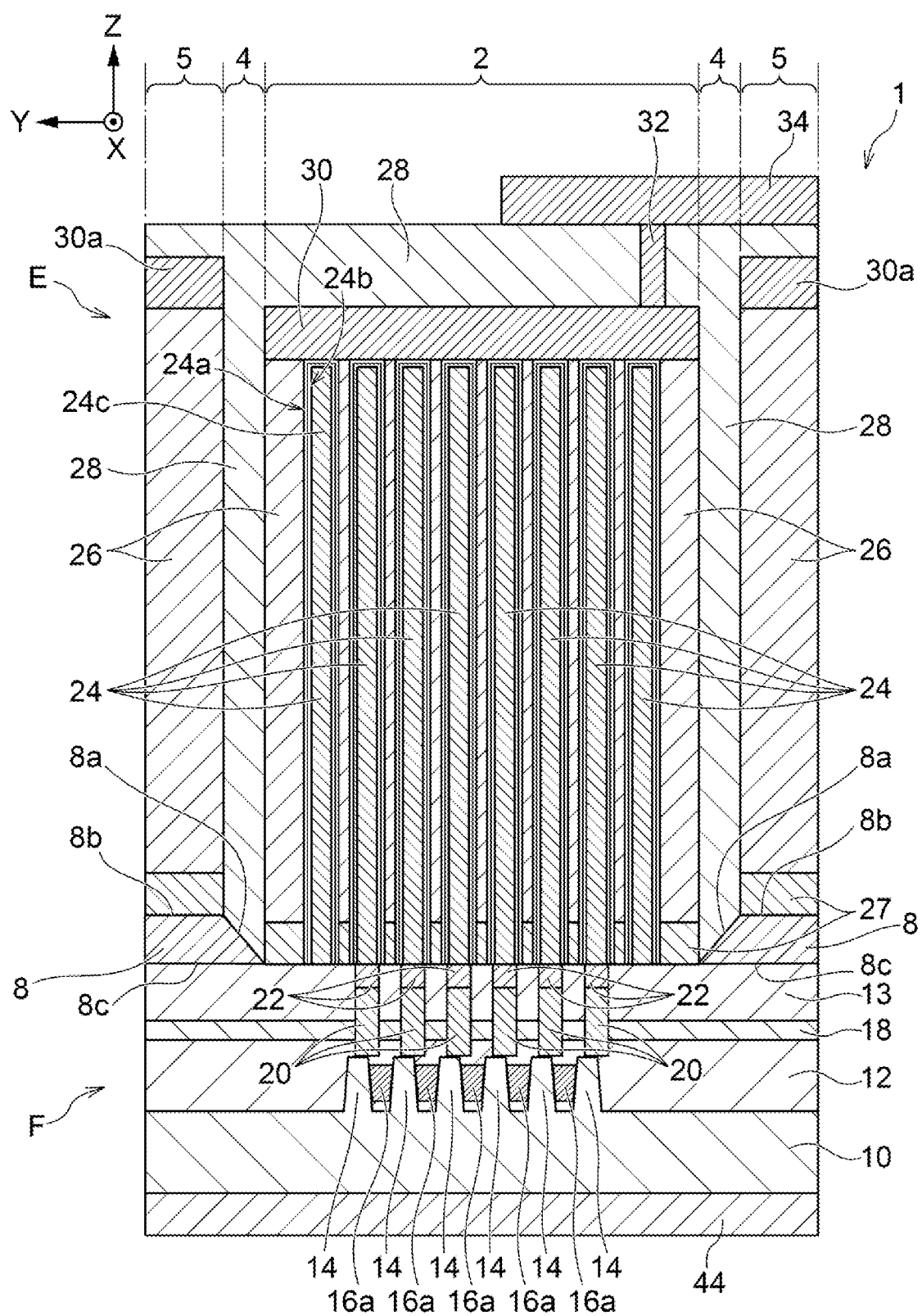
FIGS. 3 and 4 are diagrams illustrating the semiconductor device and the method of manufacturing the same according to the embodiment, and is a longitudinal section view illustrating one example of the schematic configuration in a final process stage.
Figure 4:
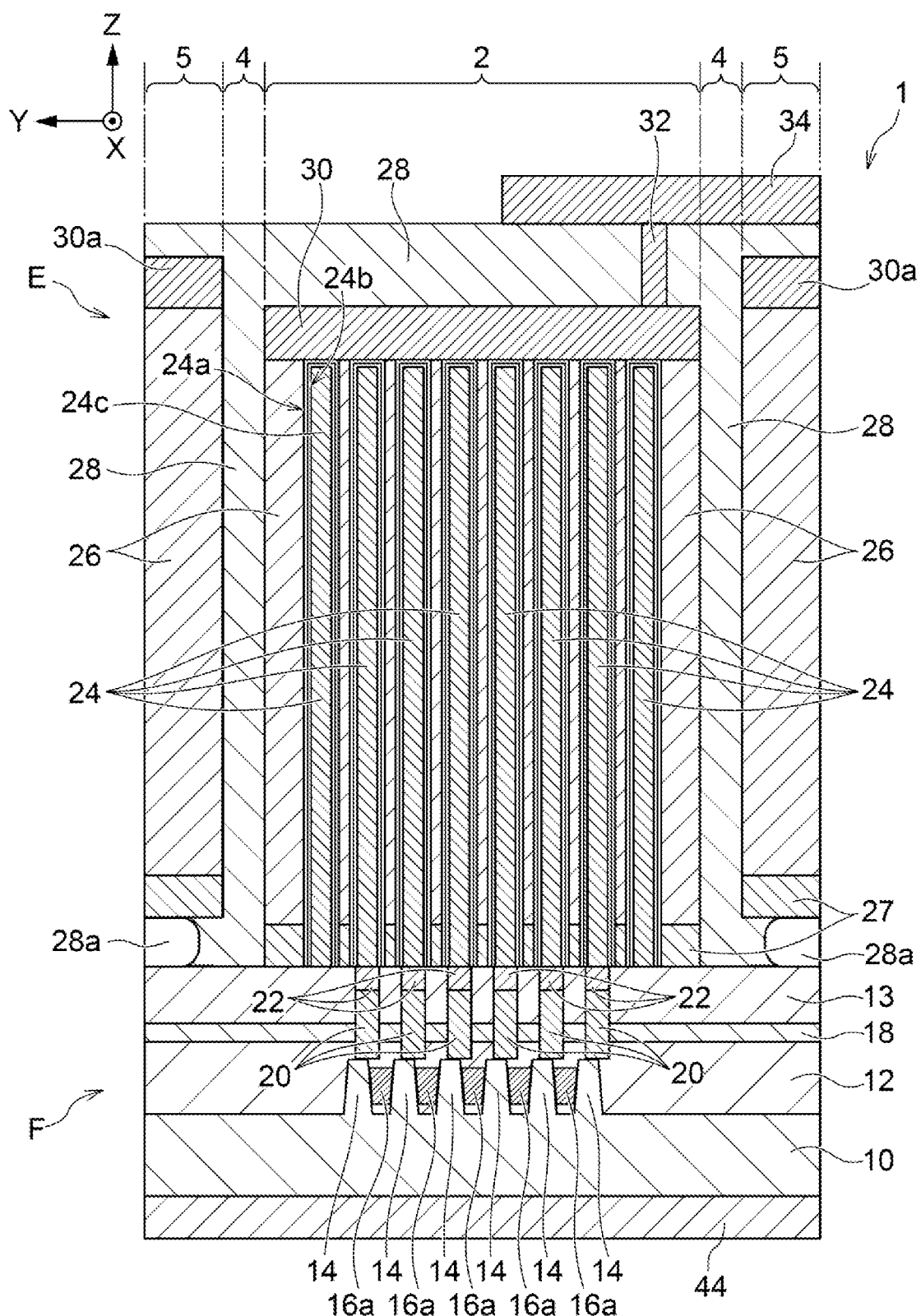

FIGS. 3 and 4 are longitudinal section views illustrating a schematic configuration of the semiconductor device 1 according to the embodiment. FIG. 3 is a longitudinal section view illustrating the schematic configuration of a portion along the line A-A in FIG. 1. FIG. 4 is a longitudinal section view illustrating the schematic configuration of a portion along the line B-B in FIG. 1.

As illustrated in FIGS. 3 and 4, the memory mat edge portion 4 and the peripheral circuit portion 5 are disposed on either side of a memory mat region 2. The semiconductor device 1 is provided with a memory cell structure E and a base structure F. In FIGS. 3 and 4, the memory cell structure E is disposed in the upper part, while the base structure F is disposed in the lower part. The memory cell structure E is provided with a first unit including the storage capacitors 24 positioned in the upper part of one of the memory mat regions 2 in FIGS. 3 and 4. The base structure F is provided with a second unit including the access transistor 16 positioned in the lower part of one of the memory mat regions 2 in FIGS. 3 and 4. The memory cell structure E and the base structure F are divided respectively into the first unit and the second unit including the memory mat regions 2, the memory mat edge portions 4, and the peripheral circuit portion 5. The interface structure 8 is disposed between the memory cell structure E and the base structure F.

The memory cell structure E is provided with a plurality of storage capacitors 24. In FIG. 3, the storage capacitors 24 have a pillar shape or a cup shape that is long in the Y direction and narrow in the X direction. The storage capacitors 24 are provided with a multilayer including a first conductive film 24a, a high-K film 24b, and a second conductive film 24c on the inner walls of each long and narrow cup. The first conductive film 24a functions as an upper electrode, the high-K film 24b functions as a capacitive insulating film, and the second conductive film 24c functions as a lower electrode.

The first conductive film 24a and the second conductive film 24c are provided with a conductive material. The first conductive film 24a is provided with titanium nitride (TiN), for example. The second conductive film 24c is provided with titanium nitride and ruthenium (Ru), for example. The high-K film 24b contains an insulating material having a high relative permittivity, and for example, is provided with a metallic oxide material such as $HfO_2$, $ZrO_2$, or $Al_2O_3$.

A plate electrode 30 electrically connected to the first conductive film 24a is provided above the storage capacitors 24. The plate electrode 30 is further connected to an upper electrode 34 through a contact plug 32. The plate electrode 30 and the contact plug 32 contain a conductive material such as tungsten (W), for example. The upper electrode 34 contains a conductive material such as aluminum (Al), for example.

The storage capacitors 24 are surrounded by a first insulating film 26 in an upper portion and a second insulating film 27 in a lower portion on the sides of the storage capacitors 24. The first insulating film 26 and the second insulating film 27 contain an insulating material. The first insulating film 26 is provided with silicon dioxide ($SiO_2$), for example. The second insulating film 27 is provided with silicon nitride (SiN), for example.

The second insulating film 27 is disposed in the peripheral circuit portion 5 and a third insulating film 28 is disposed in the memory mat edge portion 4. The tops of the memory mat edge portions 4, the peripheral circuit portion 5, and the storage capacitors 24 are covered by the third insulating film 28. The third insulating film 28 contains an insulating material. The third insulating film 28 is provided with silicon dioxide ($SiO_2$), for example.

The base structure F is provided with the semiconductor substrate 10 and a dielectric film 13, and the interface structure 8 is provided on top of the base structure F. Also, in the base structure F, an isolation 12, gate electrodes 16a, and active areas 14 demarcated by the isolation 12 and the gate electrodes 16a are formed in the semiconductor substrate 10. The active areas 14 are the source/drain regions of the access transistors 16.

As the semiconductor substrate 10, a single-crystal semiconductor substrate such as a single-crystal silicon substrate is used, for example. The isolation 12 is obtained by forming grooves in the semiconductor substrate 10 and burying an insulating material in the grooves. For example, silicon dioxide ($SiO_2$) is buried in the isolation 12. The isolation 12 functions as an isolation region that electrically isolates elements from each other. The dielectric film 13 is provided with an insulating material such as silicon nitride (SiN), for example. The interface structure 8 is provided with an insulating material such as silicon dioxide ($SiO_2$), for example. A wrapping film 44 is provided underneath the semiconductor substrate 10. The wrapping film 44 is provided with silicon nitride (SiN), for example.

The interface structure 8 is formed straddling the peripheral circuit portion 5 and the memory mat edge portion 4, and surrounds the memory mat region 2. The memory mat edge portion 4 is disposed between the memory mat region 2 and the peripheral circuit portion 5. The interface structure 8 has a trapezoidal cross section having an inclined face 8a on the side. A bottom face 8c of the interface structure 8 adjoins the top face of the dielectric film 13. The first insulating film 26 of the base structure F of the peripheral circuit portion 5 adjoins a top face 8b of the interface structure 8. The third insulating film 28 of the memory mat edge portion 4 adjoins the inclined face 8a of the interface structure 8. The interface structure 8 is not disposed in the central part of the memory mat region 2. The bottom faces of the storage capacitors 24 are aligned with the position of the top face of the dielectric film 13 in the Z direction and also with the position of the bottom face 8c of the interface structure 8 in the Z direction. A void 28a where the third insulating film 28 is not buried between the dielectric film 13 and the second insulating film 27 is provided in the peripheral circuit portion 5.

The gate electrodes 16a are formed in the active areas 14. In the embodiment, the gate electrodes 16a are formed as the gate electrodes of the trench-gate access transistors 16. The gate electrodes 16a contain a conductive material, and for example, are provided with at least one of titanium nitride (TiN), ruthenium (Ru), tungsten nitride (WN), tungsten (W), and poly-silicon (poly-Si).

Also, the base structure F includes the bit lines 18, and each bit line 18 is connected to one side of the active areas 14 by a connecting portion not illustrated. The bit lines 18 contain a conductive material, and for example, are provided with at least one of tungsten silicide (WSi), tungsten nitride (WN), tungsten (W), titanium nitride (TiN), and ruthenium (Ru).

Contact plugs 20 and contact pads 22 are connected to the other side of the active areas 14, and the contact pads 22 are connected to the second conductive film 24c of the storage capacitors 24. As above, the semiconductor device 1 according to the embodiment includes one-transistor, one-capacitor type DRAM memory cells provided with the gate electrodes 16a, the active areas 14, the bit lines 18, and the storage capacitors 24.

Next, FIGS. 3 to 16 will be referenced to describe a method of manufacturing the semiconductor device 1 according to the embodiment.

Figure 5:
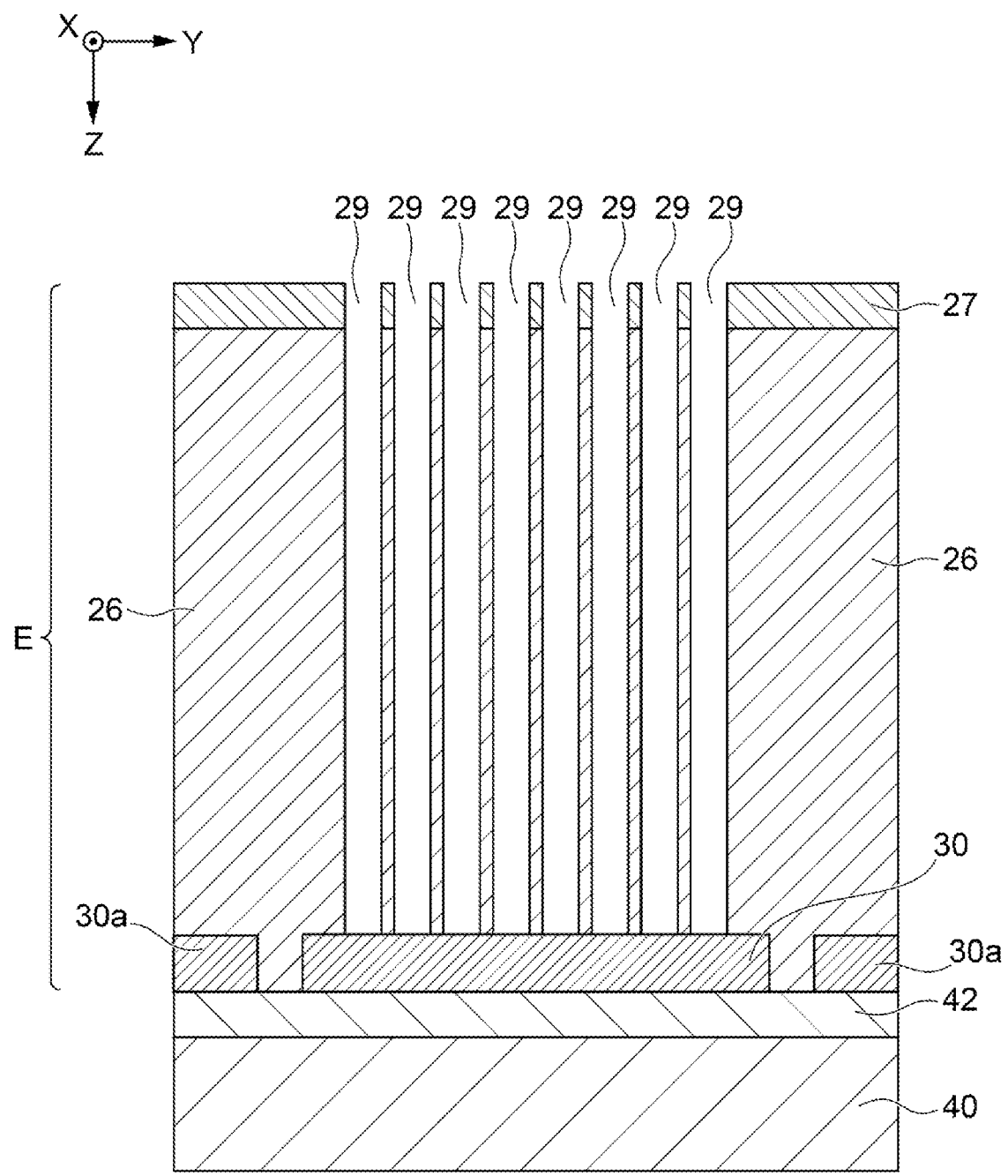
FIGS. 5 to 16 are diagrams illustrating the method of manufacturing the semiconductor device according to the embodiment, and are longitudinal section views sequentially illustrating one example of the schematic configuration in exemplary process stages.
Figure 6:
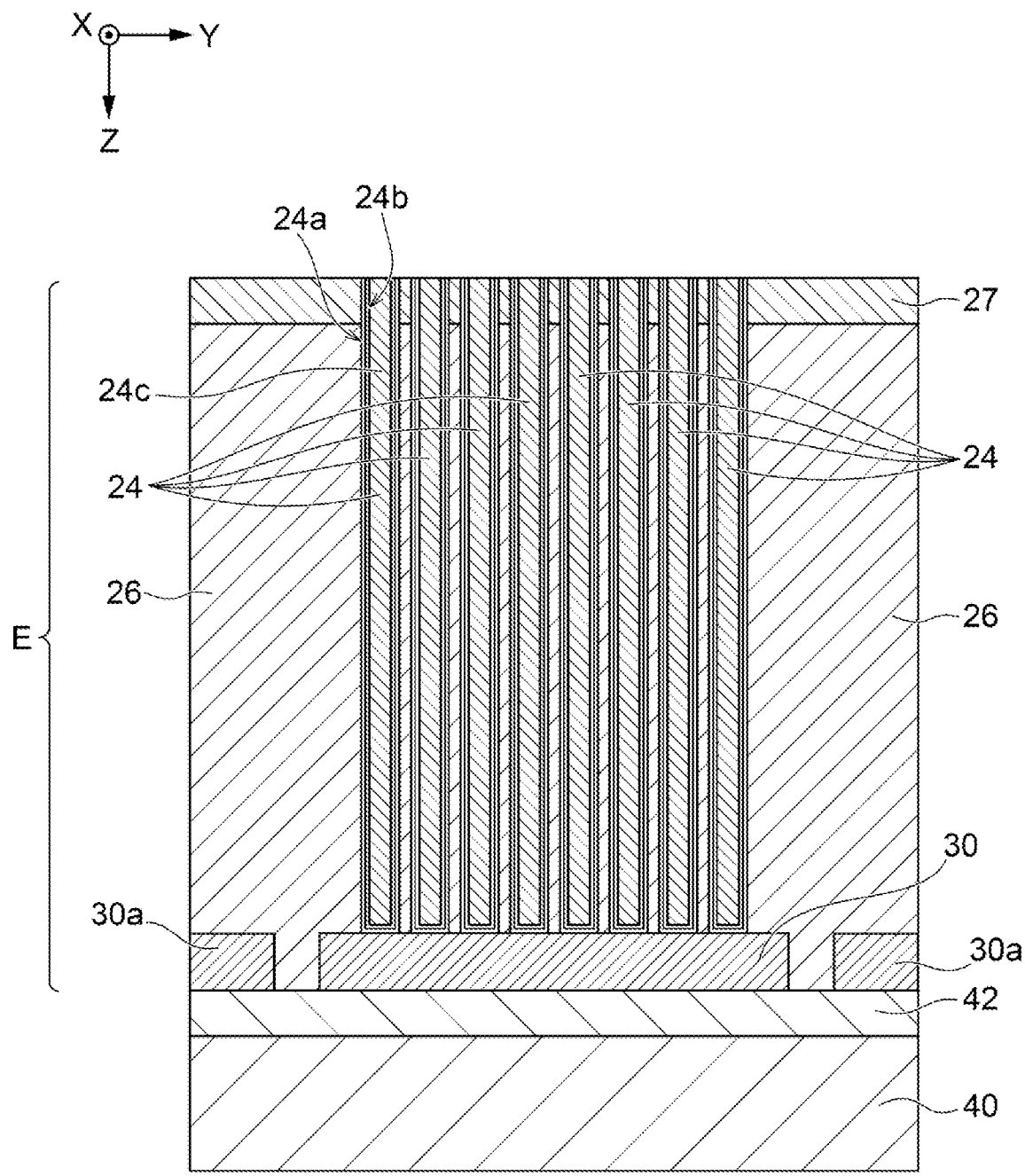

FIGS. 5 and 6 will be referenced to describe a method of forming the memory cell structure E.

As illustrated in FIG. 5, first, a cutting layer 42 is formed on the base substrate 40. The memory cell structure E is formed on top of the cutting layer 42. The plate electrode 30, the first insulating film 26, and the second insulating film 27 are formed on the cutting layer 42.

As the base substrate 40, a single-crystal semiconductor substrate such as a single-crystal silicon substrate is used, for example. The cutting layer 42 is provided with an insulating material such as silicon nitride (SiN), for example. The plate electrode 30 is provided with a conductive material such as aluminum, for example. The first insulating film 26 is provided with an insulating material such as silicon dioxide ($SiO_2$), for example. The second insulating film 27 is provided with an insulating material such as silicon nitride (SiN), for example.

The cutting layer 42, the first insulating film 26, and the second insulating film 27 are formed by Chemical Vapor Deposition (hereinafter referred to as CVD), for example. For example, the plate electrode 30 is obtained by depositing aluminum using CVD or sputtering, and then patterning the deposited aluminum by employing known lithography technology and known anisotropic dry etching technology. The plate electrode 30 is divided at the ends, and plate electrodes 30a are formed as illustrated in FIG. 3.

Next, known lithography technology and known anisotropic dry etching technology are used to etch the second insulating film 27 and the first insulating film 26. With this arrangement, a plurality of grooves 29 penetrating from the top face of the second insulating film 27 to the top face of the plate electrode 30 are formed. Each of the grooves 29 has a hole shape extending in a long and narrow shape in the Y direction of the diagram.

Next, as illustrated in FIG. 6, the first conductive film 24a, the high-K film 24b, and the second conductive film 24c are formed and buried inside the grooves 29. The first conductive film 24a, the high-K film 24b, and the second conductive film 24c are formed using CVD.

Thereafter, the first conductive film 24a, the high-K film 24b, and second conductive film 24c are etched back to remove the excess first conductive film 24a, high-K film 24b, and second conductive film 24c formed on the top face of the second insulating film 27. With this arrangement, the first conductive film 24a, the high-K film 24b, and the second conductive film 24c are buried inside the grooves 29. The first conductive film 24a and the plate electrode 30 are in contact with each other and have electrical continuity.

The first conductive film 24a is provided with a conductive material such as titanium nitride (TiN), for example. The high-K film 24b contains an insulating material having a high relative permittivity, and for example, is provided with a metallic oxide including a metal such as zirconium (Zr) or aluminum (Al). The second conductive film 24c is provided with a conductive material such as titanium nitride (TiN) and ruthenium (Ru), for example. The upper edge face of the second conductive film 24c is exposed.

Figure 7:
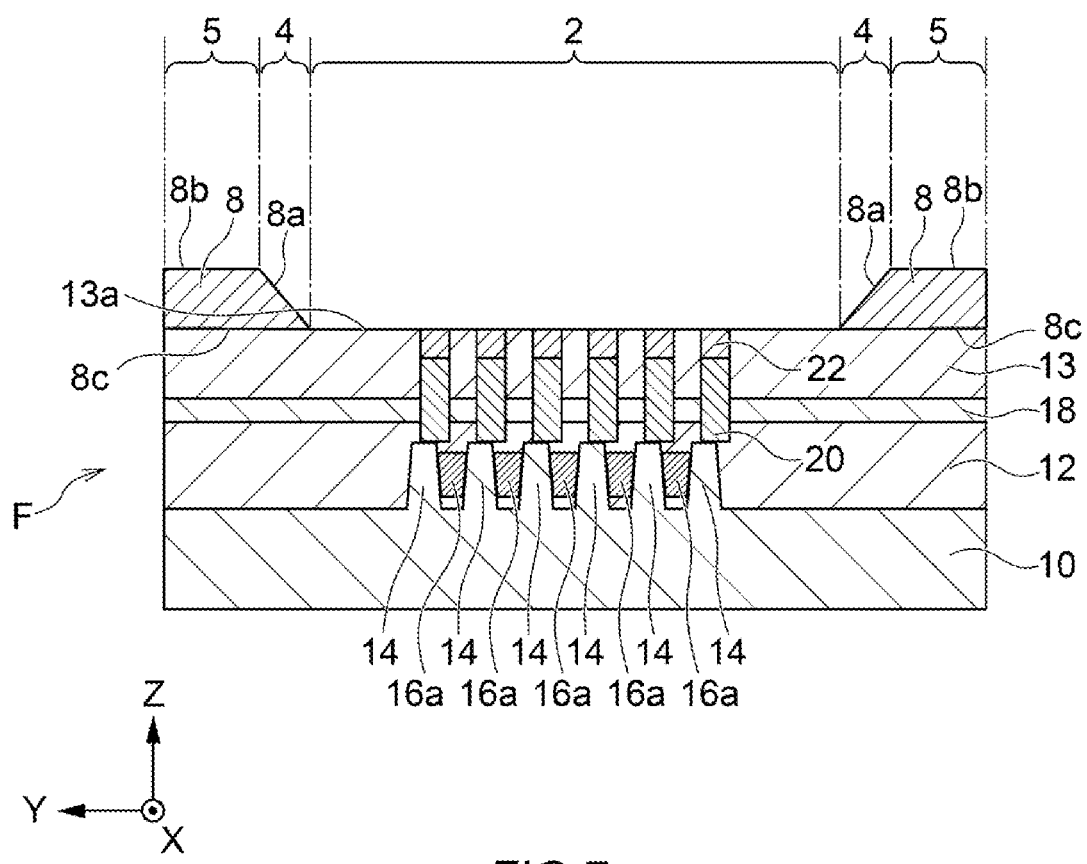
Figure 8:
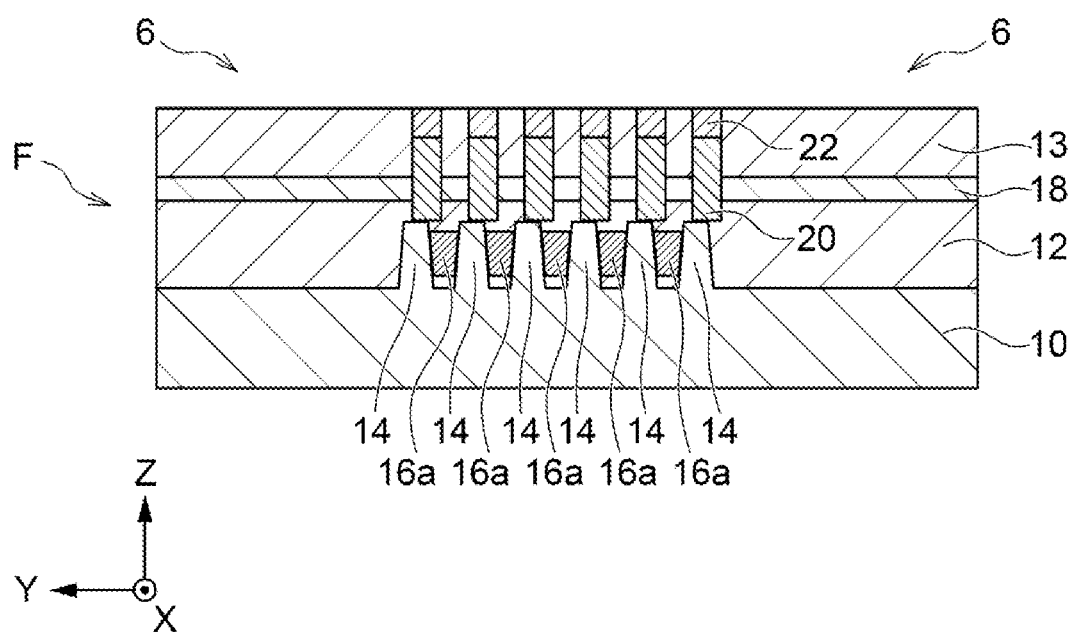
Figure 9:
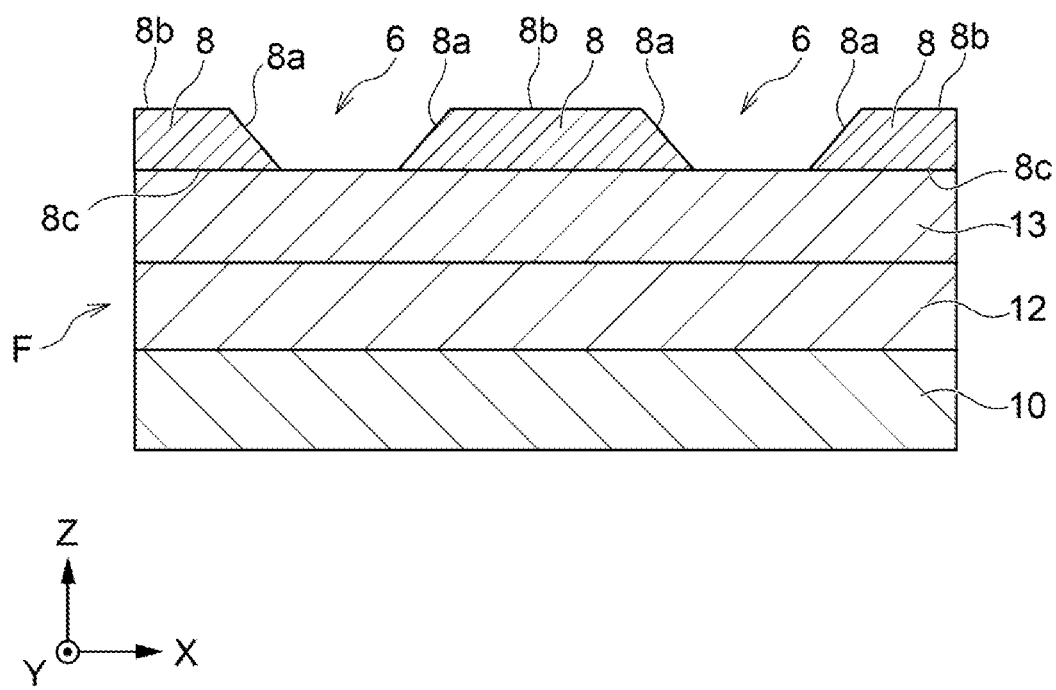

The base structure F and the interface structure 8 are created as follows. As illustrated in FIGS. 7, 8, and 9, the isolation 12, the active areas 14, and the gate electrodes 16a of the access transistors 16 are formed on the semiconductor substrate 10. The isolation 12 is formed by forming grooves in the semiconductor substrate 10 and burying an insulating material such as silicon dioxide ($SiO_2$) for example in the grooves. The gate electrodes 16a are formed by forming grooves in the active areas 14, and thereafter burying a conductive material in the grooves. Next, after forming the bit line 18, the dielectric film 13 is formed.

The bit line 18 is formed by CVD or sputtering, for example. The bit line 18 is patterned by performing lithography and anisotropic dry etching on a deposited conductive material.

The dielectric film 13 is provided with an insulating material such as silicon nitride (SiN), for example. Inside the dielectric film 13, a plurality of contact plugs 20 that connect to the top face of each of the active areas 14 are provided. Furthermore, contact pads 22 that connect to the top face of each of the contact plugs 20 are provided. The contact plugs 20 and the contact pads 22 are provided with a conductive material such as tungsten (W), for example. A barrier metal, for example, such as titanium nitride (TiN) may also be provided between the contact plugs 20 and the active areas 14.

Next, an insulating film is formed so as to cover the top face of the dielectric film 13 and the contact pads 22. Known lithography technology is used to form a mask not illustrated that is open to the memory mat region 2 and the air holes 6 on the insulating film, and thereafter the insulating film is etched by performing wet etching. The insulating film is provided with silicon dioxide ($SiO_2$) and is deposited by CVD, for example. The etching is performed using buffered hydrofluoric acid, for example. The etching is performed so that the top face 13a of the dielectric film 13 and the top faces of the contact pads 22 in the memory mat region 2 are exposed. With this arrangement, depressions are formed in the memory mat region 2. These depressions later become the cavity regions 50. Also, the remaining portion of the insulating film surrounding the memory mat region 2 is the interface structure 8. Also, in the peripheral circuit portion 5, the depressions formed in the insulating film are the air holes 6. A depressed concave shape in the memory mat region 2 is formed by the top face 13a of the dielectric film 13, the top face of the contact pads 22, and the interface structure 8. The wet etching is isotropic, and consequently the inclined face 8a is formed on the horizontal ends of the interface structure 8. Isotropic dry etching may also be performed instead of wet etching. The interface structure 8 acts as a wall surrounding the cavity regions 50, with the air holes 6 penetrating the interface structure 8 in the horizontal direction.

Figure 10:
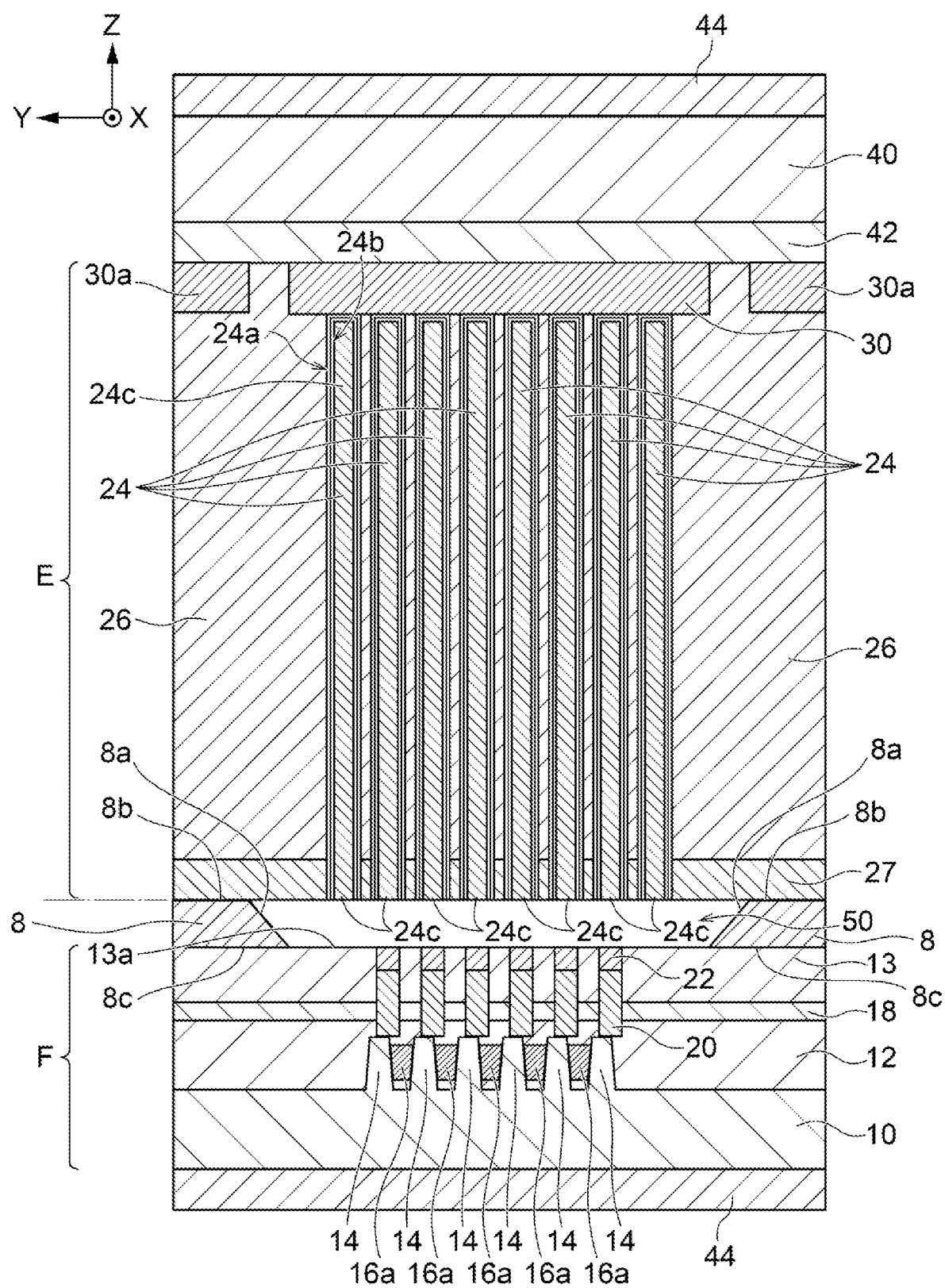
Figure 11:
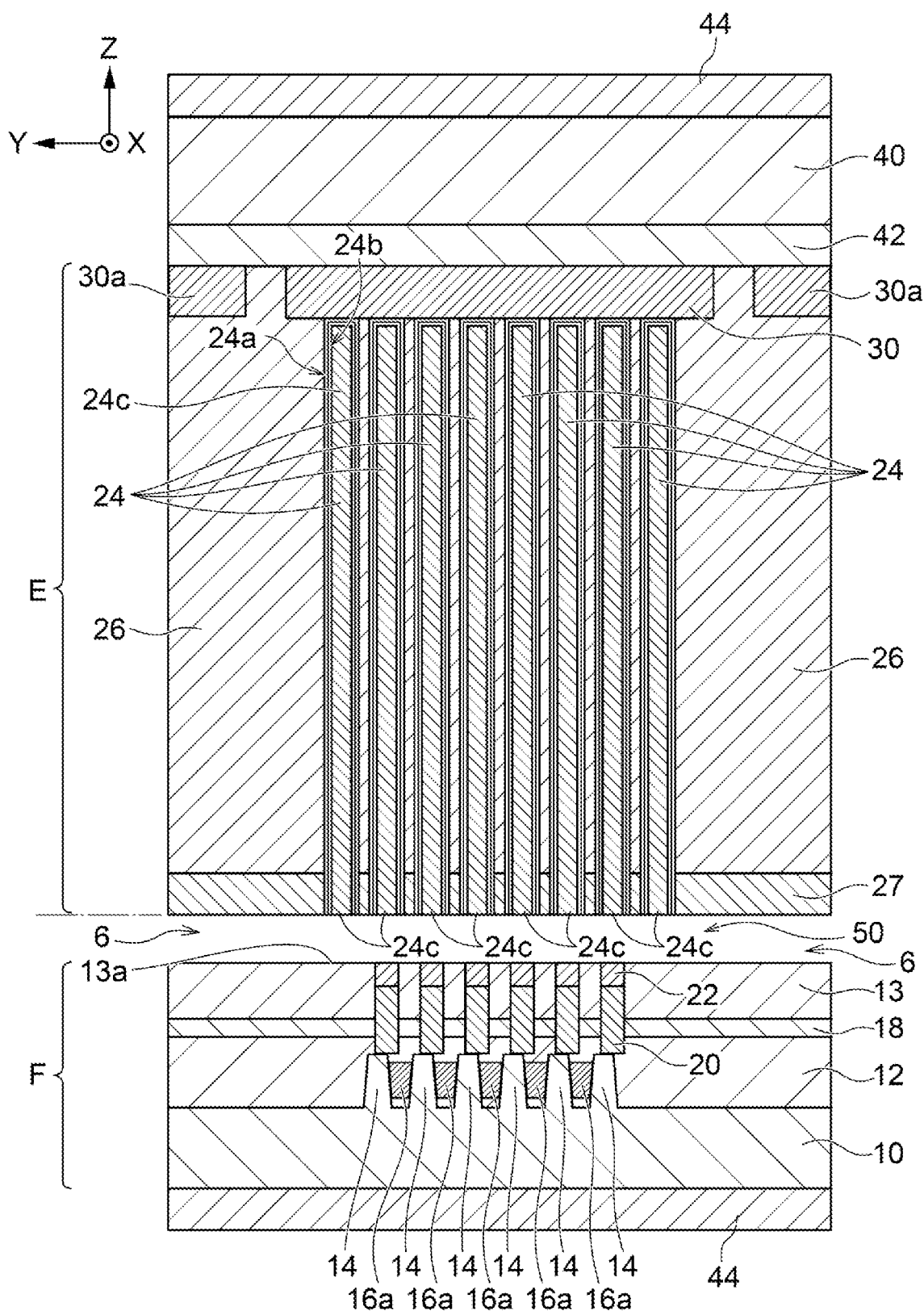
Figure 12:
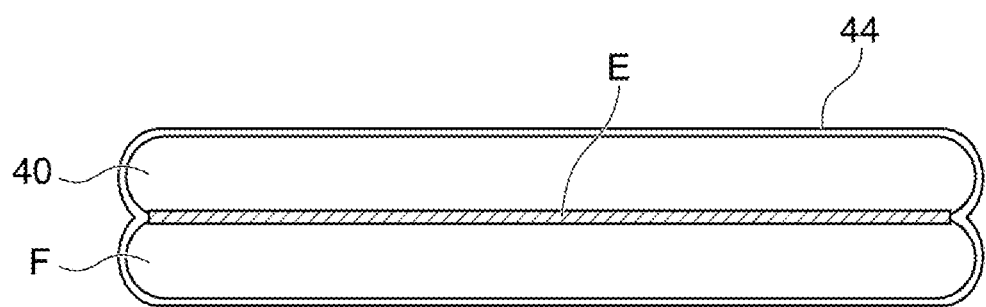

With this arrangement, after preparing the base substrate 40 provided with the memory cell structure E and the semiconductor substrate 10 provided with the base structure F, the base substrate 40, or in other words the memory cell structure E, is inverted vertically as illustrated in FIGS. 10, 11, and 12. Thereafter, the base substrate 40 provided with the memory cell structure E and the semiconductor substrate 10 provided with the base structure F are joined by a fusion bonding method.

In the fusion bonding method, first, a treatment to attach a large number of hydroxyl groups to the surfaces of the memory cell structure E and the base structure F, or in other words a hydrophilization treatment, is performed. Next, the memory cell structure E and the base structure F are bonded to each other by aligning and joining the surfaces of the memory cell structure E and the base structure F subjected to the hydrophilization treatment. Joining according to the fusion bonding method is formed by hydrogen bonds between the hydroxyl groups on the hydrophilized surfaces. Joining according to the fusion bonding method can be performed at room temperature.

At this time, the memory cell structure E and the base structure F are superimposed, stacked, and joined while also being positioned. The positioning is performed by, for example, forming alignment marks, not illustrated, on the memory cell structure E and the base structure F in advance, and detecting the alignment marks.

When joining, the bottom face of the second insulating film 27 of the memory cell structure E comes into contact with the top face 8b of the interface structure 8 of the base structure F in the peripheral circuit portion 5. As a result, the memory cell structure E is stacked with base structure F, which mechanically supports the memory cell structure E. At this time, the depression formed in the memory mat region 2 is covered by the bottom of the memory cell structure E, and the cavity region 50 is formed. The cavity region 50 is the space enclosed by the bottom face of the memory cell structure E, or in other words the bottom face of the second insulating film 27 as well as the bottom face of the storage capacitors 24, the side faces of the interface structure 8, and the top face 13a of the dielectric film 13 as well as the top face of the contact pads 22. Additionally, air inside the cavity region 50 can move outside the cavity region 50 through the air holes 6. The air holes 6 function as leak paths connecting the cavity region 50 to the atmosphere surrounding the memory cell structure E, the second insulating film 27, and the like. The air holes 6 extend at right angles to the layering direction of the memory cell structure E and the base structure F.

Next, as illustrated in FIGS. 10, 11, and 12, the wrapping film 44 is formed around the structure obtained by the joining of the base substrate 40 provided with the memory cell structure E and the semiconductor substrate 10 provided with the base structure F. The wrapping film 44 is provided with an insulating material such as silicon nitride (SiN), for example. The wrapping film 44 is formed by vacuum CVD. When forming the wrapping film 44 by vacuum CVD, the joined semiconductor substrate 10 and base substrate 40 are placed inside a depressurized film deposition chamber not illustrated. All of the cavity regions 50 are connected, through the air holes 6, to the atmosphere inside the film deposition chamber not illustrated covering the semiconductor substrate 10 and the base substrate 40. With this arrangement, a depressurized vacuum is created in all of the cavity regions 50. Thereafter, the wrapping film 44 is deposited so as to cover the semiconductor substrate 10 and the base substrate 40. With the wrapping film 44, the semiconductor substrate 10 and the base substrate 40 in the joined state can be wrapped airtight. Consequently, the interiors of the cavity regions 50 are sealed airtight by the wrapping film 44 in a state preserving the depressurized conditions.

Figure 13:
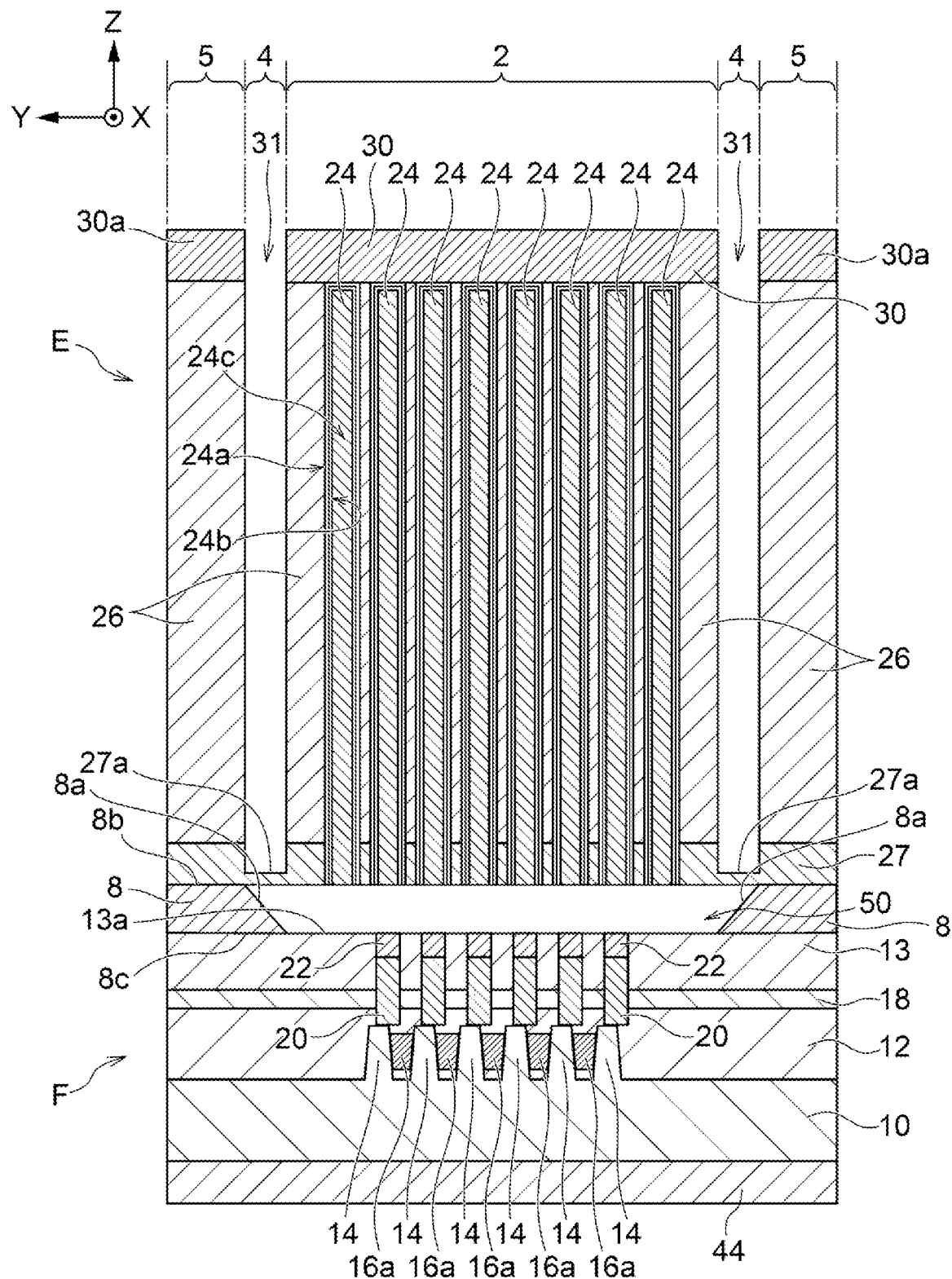
Figure 14:
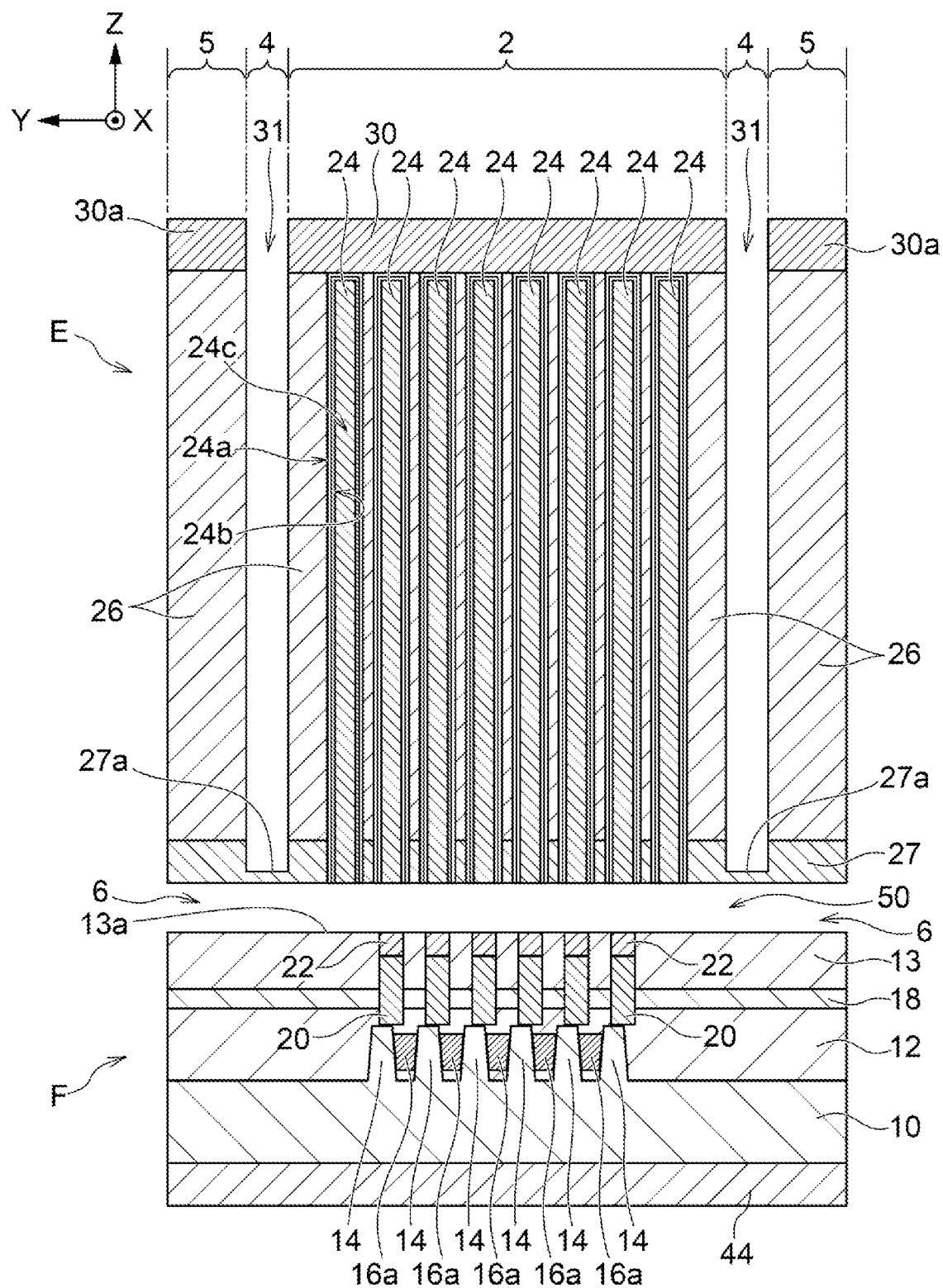

Next, as illustrated in FIGS. 13 and 14, the base substrate 40 is peeled from the wrapping film 44. Since the adhesion between the base substrate 40 and the wrapping film 44 is poor, the base substrate 40 can be pulled and thereby peeled from the wrapping film 44. At this time, the depressurized conditions inside the cavity regions 50 are preserved. When peeling the base substrate 40, the existence of the depressurized vacuum in the cavity regions 50 causes the memory cell structure E to be drawn toward the cavity regions 50 when peeling the base substrate 40. Consequently, it is possible to inhibit the peeling of the memory cell structure E from the interface structure 8. Next, the cutting layer 42 is removed by etching.

Note that in the removal of the base substrate 40 and the cutting layer 42, the following method may also be performed instead of the peeling method indicated above with reference to FIGS. 10 to 14. In the following method, the wrapping film 44 is not formed after joining the memory cell structure E and the base structure F by fusion bonding. First, after joining the memory cell structure E and the base structure F by fusion bonding, the base substrate 40 is partially removed by wafer grinding. Thereafter, the remaining base substrate 40 and the cutting layer 42 are removed by dry etching. The dry etching can be performed using anisotropic or isotropic conditions. Through the above steps, the base substrate 40 and the cutting layer 42 can be removed.

The dry etching is performed in the depressurized atmosphere. The cavity regions 50 are connected, through the air holes 6, to the dry etching atmosphere surrounding the semiconductor substrate 10 and the base substrate 40. For this reason, the space inside the cavity regions 50 is also depressurized. If the air holes 6 did not exist, the space inside the cavity regions 50 would not be connected to the dry etching atmosphere. Therefore, the space inside the cavity regions 50 would not be depressurized during the dry etching. Consequently, the space inside the cavity regions 50 would be at a higher pressure than the dry etching atmosphere. For this reason, during the dry etching, the memory cell structure E would be pushed up due to the pressure difference between the space inside the cavity regions 50 and the dry etching atmosphere, and the memory cell structure E would be peeled from the interface structure 8 in some cases. However, in the case where the air holes 6 are formed in the interface structure 8 as described above, the cavity regions 50 are connected to the dry etching atmosphere through the air holes 6, and the inside of the cavity regions 50 is depressurized. Consequently, detachment of the memory cell structure E during dry etching can be inhibited.

Figure 15:
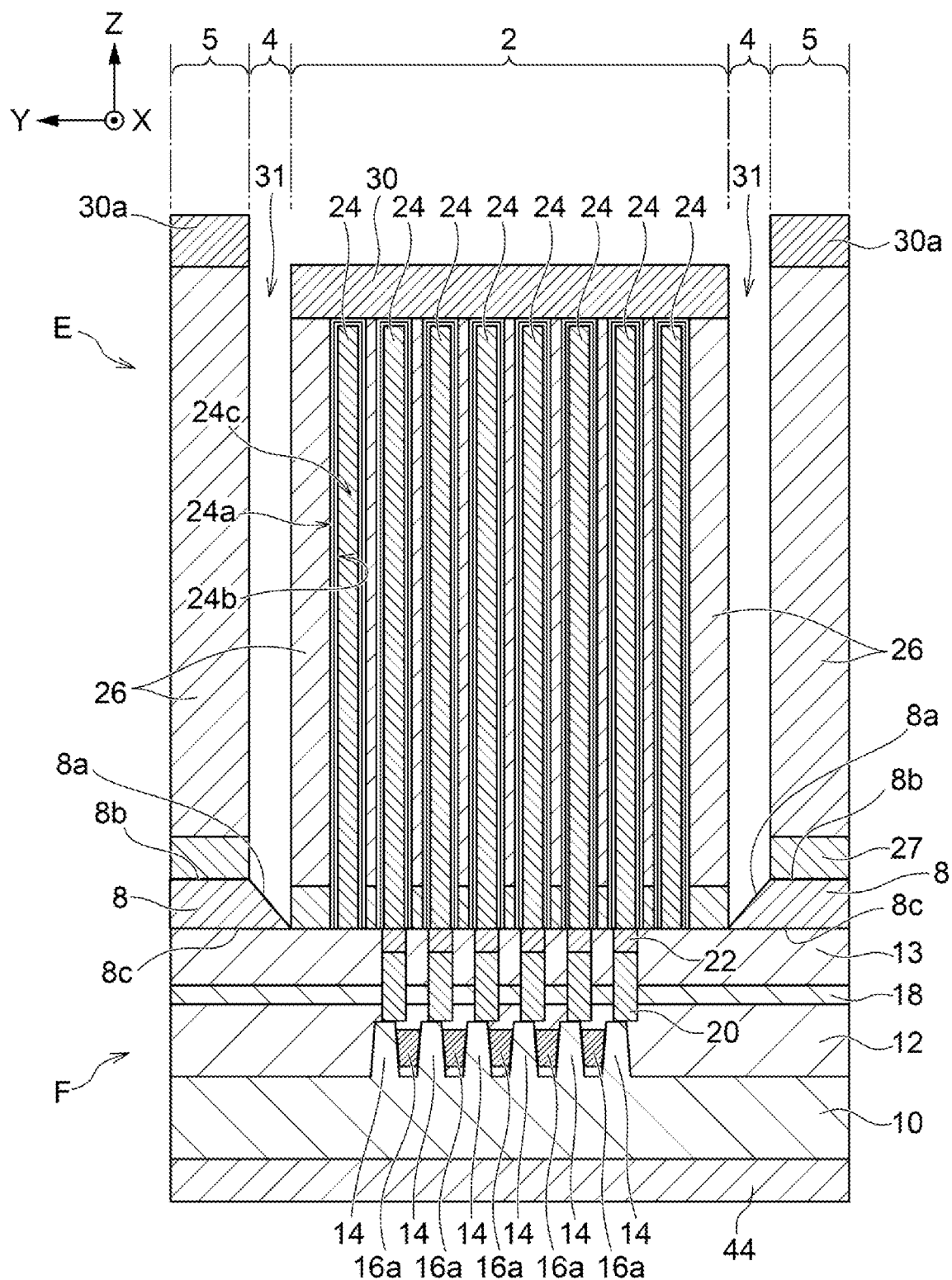
Figure 16:
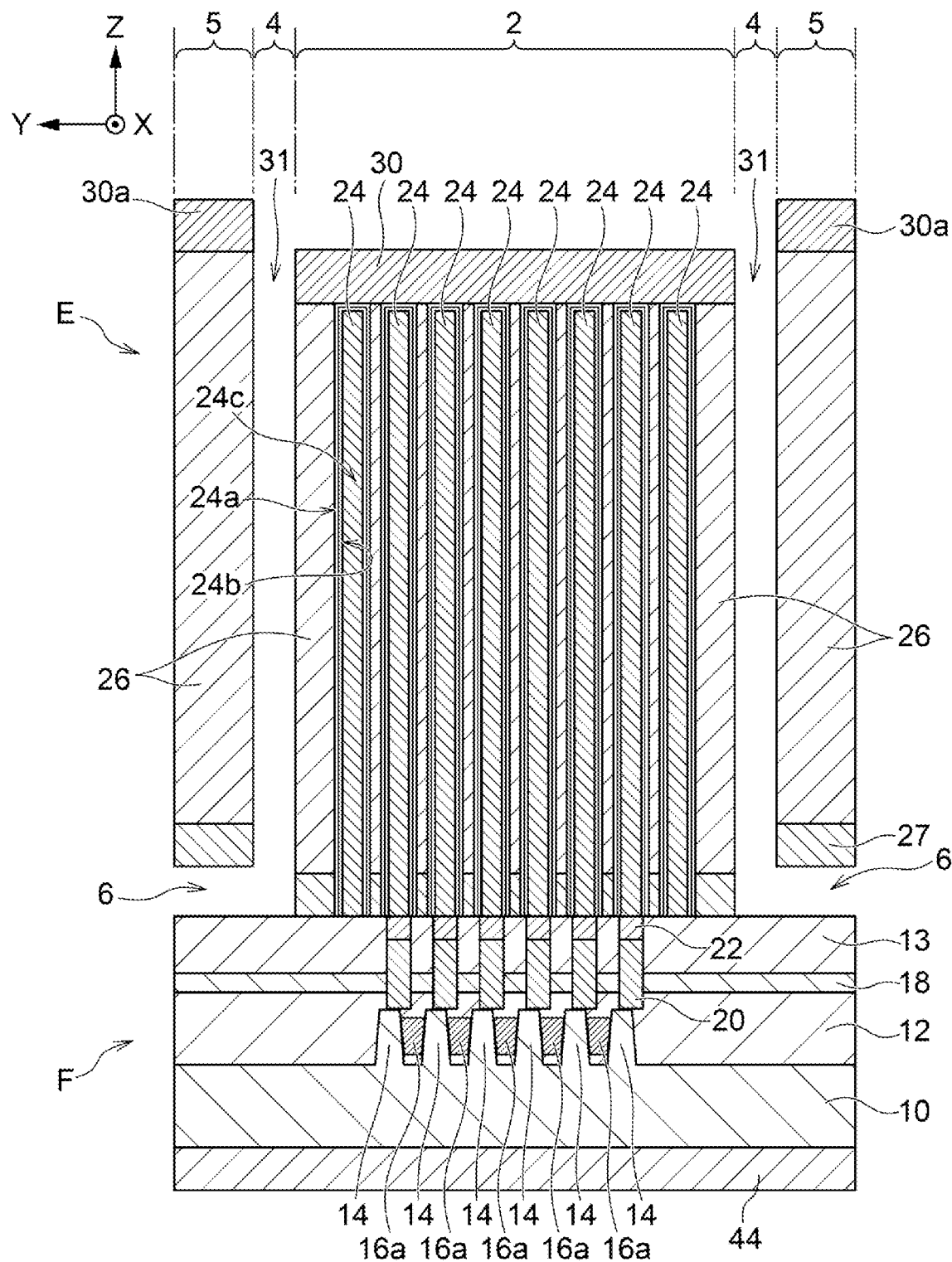

Next, FIGS. 13 to 16 will be referenced to describe a step of detaching the memory mat region 2 from the memory cell structure E to connect the storage capacitors 24 and the contact pads 22. FIGS. 13 and 14 illustrate states immediately before FIGS. 15 and 16. The change from the states illustrated in FIGS. 13 and 14 to the states illustrated in FIGS. 15 and 16 is achieved while etching grooves 31.

Next, grooves 31 are formed in the memory mat edge portions 4. The grooves 31 are formed using known lithography technology and anisotropic dry etching technology. To etch the grooves 31, Reactive Ion Etching (RIE) is used. In the first half of the etching of the grooves 31, the etching is performed under conditions such that the etch rate of the silicon dioxide ($SiO_2$) provided in the first insulating film 26 is large and the etch rate of the silicon nitride (SiN) provided in the second insulating film 27 is small. Any of various etching devices can be used as the etching device that performs the above etching, such as a microwave Electron Cyclotron Resonance (ECR) plasma device, a Capacitively Coupled Plasma (CCP) device, or an Inductively Coupled Plasma (ICP) device, for example.

By etching according to the above conditions, the formation of the grooves 31 in the memory mat edge portions 4 proceeds, and the etching progress slows upon reaching the top face of the second insulating film 27. For this reason, the uniformity of the etching amount can be improved. After the etching reaches the top face of the second insulating film 27, the etching conditions are changed to conditions suited to etching silicon nitride (SiN).

At this point, by lowering the etch rate of silicon nitride (SiN) and improving the etching controllability, the uniformity of the etching amount is improved. During this time, the memory mat region 2 and the peripheral circuit portion 5 of the memory cell structure E are connected by beams 27a formed by the remaining unetched portion of the second insulating film 27.

As etching proceeds further and the beams 27a connecting the peripheral circuit portion 5 and the memory mat region 2 of the memory cell structure E are removed, the memory mat region 2 and the peripheral circuit portion 5 of the memory cell structure E are separated. The separated memory mat region 2 moves through the cavity region 50 in the downward direction of the diagram, filling the cavity region 50 and causing the contact pads 22 and the storage capacitors 24 to connect to each other. After that, the contact pads 22 and the storage capacitors 24 are electrically connected by annealing. Through these steps, the configuration illustrated in FIGS. 15 and 16 is formed.

Next, the third insulating film 28 is formed to cover the inside of the grooves 31 and the top face of the memory cell structure E. The third insulating film 28 is provided with an insulating material such as silicon dioxide ($SiO_2$), for example. The third insulating film 28 can be formed by CVD, for example. The void 28a is formed in the empty space where the third insulating film 28 is not buried between the dielectric film 13 and the second insulating film 27 in the peripheral circuit portion 5. The void 28a is surrounded by the dielectric film 13, the second insulating film 27, and the third insulating film 28. Next, a contact hole that penetrates from the top face of the third insulating film 28 to the top face of the plate electrode 30 is formed in the third insulating film 28, and by burying a conductive material in the contact hole, the contact plug 32 is formed. Thereafter, the upper electrode 34 that connects to the contact plug 32 is formed on the third insulating film 28. The upper electrode 34 is deposited by CVD, and is patterned by lithography and anisotropic dry etching.

Through the above steps, the semiconductor device 1 according to the embodiment is formed as illustrated in FIGS. 3 and 4.

According to the semiconductor device 1 and the method of manufacturing the same according to the embodiment, the following effects are exhibited.

The interface structure 8 provided with the air holes 6 is formed around the memory mat region 2 of the base structure F. Thereafter, the base substrate 40 provided with the memory cell structure E and the semiconductor substrate 10 provided with the base structure F are joined by the fusion bonding method. With this arrangement, the cavity regions 50 and the air holes 6 that act as leak paths for all of the cavity regions 50 are formed. Additionally, the wrapping film 44 that airtightly seals the joined semiconductor substrate 10 and the base substrate 40 is deposited by the vacuum CVD method. Thereafter, the base substrate 40 is peeled. According to this method, the base substrate 40 can be peeled while maintaining a depressurized vacuum inside the cavity regions 50, thereby pulling the memory cell structure E provided with the storage capacitors 24 toward the cavity regions 50. With this arrangement, detachment of the base substrate 40 with the memory cell structure E can be inhibited. Accordingly, since it is possible to keep the memory cell structure E from peeling away from the interface structure 8, the yield of the semiconductor device 1 is improved and cost savings for the semiconductor device 1 are achieved.

The semiconductor device 1 having a one-transistor, one-capacitor structure is achieved by forming the memory cell structure E and the base structure F separately, and then connecting the two structures to each other. For this reason, the application of an unwanted heat treatment to the access transistor 16 mounted in the base structure F can be avoided. For this reason, the performance of the access transistor 16 can be improved.

In the formation of the storage capacitors 24, first, the cup-shaped grooves 29 are formed, and the first conductive film 24a, the high-K film 24b, and the second conductive film 24c are formed on the inner walls of the grooves 29. For this reason, because it is possible to avoid forming pillars of the storage capacitors 24, collapsing of the storage capacitors 24 can be avoided, making it possible to improve the yield of the semiconductor device 1.

As above, DRAM is given as an example to describe the semiconductor device according to various embodiments, but the above description is merely one example, and not intended to be limited to DRAM. Memory devices other than DRAM, for example, such as Static Random Access Memory (SRAM), flash memory, Erasable Programmable Read Only Memory (EPROM), Magnetoresistive Random Access Memory (MRAM), and phase-change memory can be applied as the semiconductor device. Furthermore, devices other than memory, for example, logic ICs such as a microprocessor and an Application Specific Integrated Circuit (ASIC) are also applicable as the semiconductor device according to the foregoing embodiments. Furthermore, functional devices such as micro-electromechanical systems (MEMS) and the like are also applicable as the semiconductor device according to the foregoing embodiments.

Although various embodiments have been disclosed in the context of certain preferred embodiments and examples, it will be understood by those skilled in the art that the scope of the present disclosure extend beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:
   a base structure having a first portion including a plurality of transistors and a second portion surrounding the first portion;
   a storage structure on the first portion of the base structure, the storage structure including a plurality of storage capacitors each coupled to a corresponding one of the plurality of transistors;
   an interface structure on the second portion of the base structure; and
   a peripheral structure on the interface structure;
   wherein the interface structure is divided into a plurality of insulating films and the plurality of insulating films are arranged away from each other to have a plurality of voids between the second portion of the base structure and the peripheral structure.

2. The apparatus of claim 1, wherein the interface structure comprises dielectric material.

3. The apparatus of claim 1, wherein each void of the plurality of voids is surrounded by dielectric material, respectively.

4. The apparatus of claim 1, wherein each void of the plurality of voids is arranged so as to be between the storage structure and the base structure, respectively.

5. The apparatus of claim 1, wherein each of the storage capacitors comprises a first conductive film, a second conductive film, and a high-K film between the first conductive film and the second conductive film, respectively.

* * * * *

UNITED STATES PATENT AND TRADEMARK OFFICE
CERTIFICATE OF CORRECTION

| | | |
|---|---|---|
| PATENT NO. | : 11,844,208 B2 | Page 1 of 1 |
| APPLICATION NO. | : 17/678595 | |
| DATED | : December 12, 2023 | |
| INVENTOR(S) | : Mitsunari Sukekawa et al. | |

It is certified that error appears in the above-identified patent and that said Letters Patent is hereby corrected as shown below:

In the Claims

| | Reads | Should Read |
|---|---|---|
| Column 11, Line 23 Claim 1 | "An apparatus comprising" | -- An apparatus, comprising -- |

Signed and Sealed this
Fifth Day of March, 2024

Katherine Kelly Vidal
*Director of the United States Patent and Trademark Office*